12) United States Patent
Takeshima et al.

(10) Patent No.: US 6,894,423 B2
(45) Date of Patent: May 17, 2005

(54) PIEZOELECTRIC ELECTROACOUSTIC TRANSDUCER (75) Inventors: Tetsuo Takeshima, Toyama (JP); Yoshitaka Nakamura, Toyama (JP); Kiyotaka Tajima, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 140 days.

(21) Appl. No.: 10/180,002

(22) Filed: Jun. 26, 2002

(65) Prior Publication Data

US 2003/0015942 A1 Jan. 23, 2003

(30) Foreign Application Priority Data

Jul. 9, 2001 (JP) ......................................... 2001-207194

(51) Int. Cl.⁷ ............................................... H01L 41/08
(52) U.S. Cl. ........................................ 310/324; 344/348
(58) Field of Search ................................. 310/322, 324, 310/348, 344, 346, 345

(56) References Cited

U.S. PATENT DOCUMENTS

| | | | | |
|---|---|---|---|---|
| 2,353,089 A | | 7/1944 | Shapiro et al. | |
| 4,464,599 A | * | 8/1984 | Briese | 310/348 |
| 4,989,302 A | * | 2/1991 | Abe et al. | 29/25.35 |
| 5,371,428 A | * | 12/1994 | Kikuchi et al. | 310/324 |
| 5,982,077 A | * | 11/1999 | Ide et al. | 310/366 |
| 6,057,633 A | * | 5/2000 | Inoi et al. | 310/345 |
| 6,307,300 B1 | * | 10/2001 | Yamamoto et al. | 310/322 |
| 6,420,818 B1 | * | 7/2002 | Kishimoto et al. | 310/324 |
| 6,472,797 B1 | * | 10/2002 | Kishimoto | 310/324 |
| 6,472,798 B2 | * | 10/2002 | Kishimoto | 310/344 |
| 6,570,299 B2 | * | 5/2003 | Takeshima et al. | 310/348 |

FOREIGN PATENT DOCUMENTS

| | | |
|---|---|---|
| CN | 1086368 A | 5/1994 |
| CN | 1177166 A | 3/1998 |
| DE | 100 07 455 A1 | 9/2000 |
| JP | 11-004497 | 1/1999 |
| JP | 2000-310990 | 7/2000 |
| JP | 2000-312398 | 7/2000 |
| JP | 2001-119795 | 4/2001 |

* cited by examiner

Primary Examiner—Mark Budd
(74) Attorney, Agent, or Firm—Keating & Bennett, LLP (57) ABSTRACT A piezoelectric electroacoustic transducer is miniaturized and has a reduced frequency, and even when a diaphragm has a warp or winding, the resonance frequency is be stabilized. The piezoelectric electroacoustic transducer includes a substantially rectangular piezoelectric diaphragm flexurally vibrating in a thickness direction in response to the application of an alternating signal between electrodes and a casing for accommodating the piezoelectric diaphragm, wherein the casing is provided with supporting members for supporting four corners of the piezoelectric diaphragm.

20 Claims, 7 Drawing Sheets

Fig. 1A

SUPPORTING ON
ENTIRE PERIPHERY

Fig. 1B

VIBRATION NODE

DIAPHRAGM

SUPPORTING AT
CORNERS

POLARIZING AXIS

Fig. 6

POLARIZING DIRECTION

PIEZOELECTRIC ELECTROACOUSTIC TRANSDUCER

BACKGROUND OF THE INVENTION

1. Field of the Invention

The present invention relates to a piezoelectric electroacoustic transducer such as a piezoelectric buzzer and a piezoelectric receiver.

2. Description of the Related Art

In electronic devices, electronic home appliances, portable telephones, and other such electronic devices, piezoelectric electroacoustic transducers have been widely used as a piezoelectric buzzer or piezoelectric receiver for producing an alarm sound or an operating sound. A piezoelectric electroacoustic transducer of this type generally includes a circular piezoelectric element bonded to one surface of a circular metallic plate to form a unimorph-type diaphragm, and the periphery of the metallic plate is mounted on a circular case using silicone rubber while an opening of the case is closed with a cover.

However, when using a circular diaphragm, there has been a problem of low production efficiency, low acoustic conversion efficiency, and moreover, difficulty in miniaturizing the piezoelectric electroacoustic transducer.

A piezoelectric electroacoustic transducer is described in Japanese Unexamined Patent Application Publication No. 2000-310990 as improving production efficiency and acoustic conversion efficiency, and can be miniaturized by using a rectangular diaphragm. The piezoelectric electroacoustic transducer includes a rectangular piezoelectric diaphragm, an insulating case having a bottom wall, four sidewalls, and a supporting member, which is disposed inside between two of the sidewalls opposing each other for supporting the diaphragm, the supporting member being provided with first and second conductive members formed therein for external connection, and a lid plate having holes formed thereon for releasing sound. The diaphragm is accommodated within the case, where two opposite sides of the diaphragm are fixed to the supporting member with an adhesive or an elastic sealant, while gaps between the remaining two sides of the diaphragm and the case are sealed with the elastic sealant, so that the diaphragm and the first and second conductive parts are electrically connected together with a conductive adhesive, and the lid plate is bonded on the open end of the sidewalls of the case.

As another method of fixing the piezoelectric diaphragm, there is also a method of fixing the four sides of the diaphragm to the supporting member with an adhesive or an elastic sealant.

In the diaphragm, the bending vibration may occur in a length-bending mode and the bending vibration in an area-bending mode, corresponding to a manner in which the diaphragm is supported. The former is a mode of bending-vibration in the plate-thickness direction with both ends in the longitudinal direction functioning as the supports where two sides of the diaphragm are fixed to the case, and the latter is a mode in which by fixing four sides of the diaphragm to the case, the entire area of the diaphragm flexurally vibrates in the plate-thickness direction with the four sides functioning as the supports such that the intersection of the diagonal lines has the maximum displacement.

However, the bending vibration in any of a conventional length-bending mode and area-bending mode has a defect in that the resonance frequency of the diaphragm is high and the sound pressure in the low frequency range cannot be increased. When increasing the size of the case and the diaphragm, the resonance frequency can be reduced in frequency. However, the piezoelectric electroacoustic transducer will be thereby increased in size.

Also, the conventional piezoelectric electroacoustic transducer has had a problem that when the diaphragm has a warp or winding, the resonance frequency is not stabilized, because two sides or four sides of the diaphragm are strongly restrained.

SUMMARY OF THE INVENTION

In order to overcome the problems described above, preferred embodiments of the present invention provide a piezoelectric electroacoustic transducer that is miniaturized and has a reduced frequency, and even when a diaphragm has a warp or winding, the resonance frequency is stabilized.

According to a preferred embodiment of the present invention, a piezoelectric electroacoustic transducer includes a substantially rectangular piezoelectric diaphragm having electrodes and flexurally vibrating in a thickness direction in response to application of an alternating signal between the electrodes, and a casing for accommodating the piezoelectric diaphragm, wherein the casing is provided with supporting members that support four corners of the piezoelectric diaphragm.

Figures 1A, 1B:
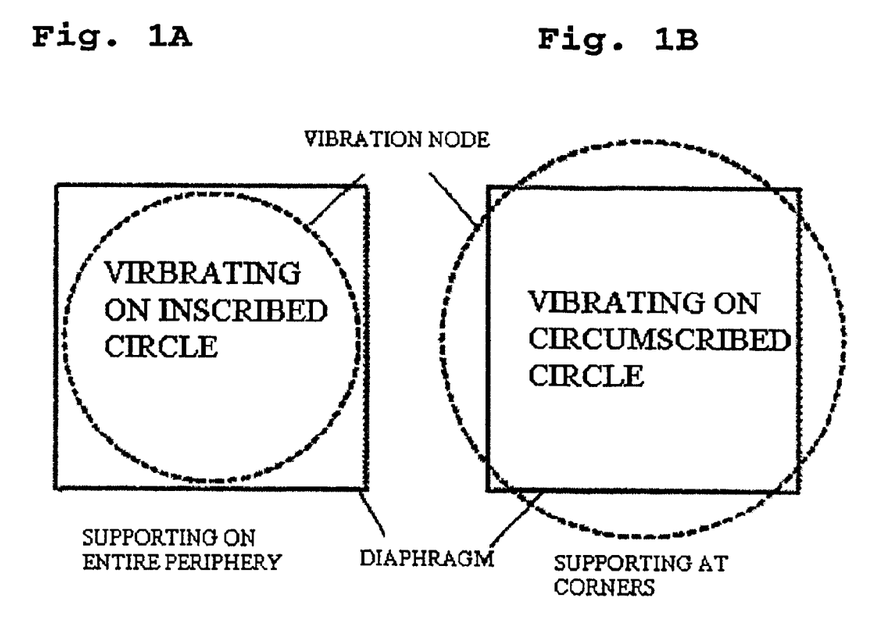
FIGS. 1A and 1B are drawings for comparing vibration nodes when supporting a diaphragm on four sides and when supporting the diaphragm at the corners thereof.

When four sides of the diaphragm are supported on the casing as usual, and also when four corners of the diaphragm are supported thereon according to preferred embodiments of the present invention, the diaphragm vibrates in an area-bending mode in both cases. However, as shown in FIGS. 1A and 1B, the node of vibration is different. That is, when supporting the four sides of the diaphragm, as shown in FIG. 1A, the diaphragm vibrates using a circle inscribed in the diaphragm as a node, whereas, when supporting the four corners of the diaphragm, as shown in FIG. 1B, the diaphragm vibrates using a circle that is substantially circumscribed with the diaphragm as a node. Therefore, the maximum displacement, i.e., the sound pressure, at the center of the circle is larger in the latter in comparison with that of the former. Also, the displacing area of the diaphragm is larger in the latter in comparison with that of the former, so that the vibration frequency is lower in the latter, enabling the low frequency to be achieved even in the diaphragm with the same external size.

FIGS. 1A and 1B show the comparison between supporting the four sides of the diaphragm in the different manners described above. Even when compared to the case of supporting two sides of the diaphragm, in the supporting structure according to preferred embodiments of the present invention, the restricting force for the diaphragm is greatly reduced, so that low frequency can be achieved and moreover, the sound pressure in a low-frequency range can be increased.

As described above, by supporting the four corners of the diaphragm, miniaturization and reduction in frequency can be achieved because the diaphragm is freely deflectable, and even when the diaphragm has a warp or winding, variations in the resonance frequency are prevented.

A piezoelectric electroacoustic transducer according to preferred embodiments of the present invention may further include terminal electrodes having internal connections exposed in vicinities of the supporting members and external connections exposed on the external surface of the casing and electrically connecting to the internal connections, and conductive adhesives, wherein the electrodes of the piezoelectric diaphragm and the internal connections of the terminal electrodes may be electrically connected together with the conductive adhesives.

That is, in order to cause the diaphragm to vibrate flexurally in an area bending mode, it is necessary to apply an alternating signal between the electrodes of the diaphragm. By connecting the electrodes of the diaphragm to the internal connections exposed in the vicinities of the supporting members of the casing with the conductive adhesives, the alternating signal can be applied by reducing the restraining force acting against the vibration of the diaphragm as much as possible.

In addition, when a urethane conductive paste is used as the conductive adhesive, for example, the restraining force against the diaphragm need not be large due to its elasticity after curing.

Preferably, a gap between the external periphery of the piezoelectric diaphragm and the internal periphery of the casing is sealed with an elastic sealant.

Even when the diaphragm flexurally vibrates in the area bending mode, if there is a gap between the diaphragm and the casing, air leaks therethrough so that sound pressure cannot be obtained. By sealing the gap between the external periphery of the diaphragm and the internal periphery of the casing with the elastic sealant, the air leakage can be eliminated without impeding the vibration of the diaphragm.

For the elastic sealant, a silicone adhesive may be used, for example, and other sealants may also be used.

Preferably, the piezoelectric diaphragm includes a film attached at least to the external periphery of the diaphragm, and a gap between the piezoelectric diaphragm and the casing is sealed by melting or bonding the film in the internal periphery of the casing.

Although the gap between the diaphragm and the casing can be sealed by applying the elastic sealant, when the elastic sealant having an excessive thickness adheres to the clearance between the diaphragm and the casing, there is a possibility of damping the vibration. Whereas, when the diaphragm and the casing are connected with the thin film, the diaphragm is liable to vibrate so as to able to obtain high sound pressure.

The film may be attached only to the periphery of the diaphragm or may be attached to the entire surface of the diaphragm.

Preferably, the supporting members provided in the casing are projections for point-supporting vicinities of four corners of the piezoelectric diaphragm.

That is, although the supporting members may be flat so as to support the four corners of the diaphragm on its surfaces, wherein the contact area is increased so that the vibration may be damped. Whereas, when the supporting members are projections, the diaphragm is scarcely restrained, thereby improving sound pressure characteristics.

In this case, when opposing projections are arranged in the upper and lower portion of the casing so as to clamp the corners of the diaphragm between the projections, fixing with the adhesive can be eliminated to simplify the manufacturing process and damping of the vibration can be eliminated due to the reduced supporting area.

Other features, elements, characteristics and advantages of the present invention will become more apparent from the following detailed description of preferred embodiments thereof with reference to the attached drawings.

DETAILED DESCRIPTION OF PREFERRED EMBODIMENTS

FIGS. 2 to 6 show a surface-mount-type piezoelectric electroacoustic transducer according to a first preferred embodiment of the present invention.

The electroacoustic transducer according to the present preferred embodiment is for use in wide-range frequencies, such as a piezoelectric receiver, and includes a layered-structure piezoelectric diaphragm 1, a case 10, and a lid plate 20. The case 10 and the lid plate 20 constitute a casing.

Figure 5:
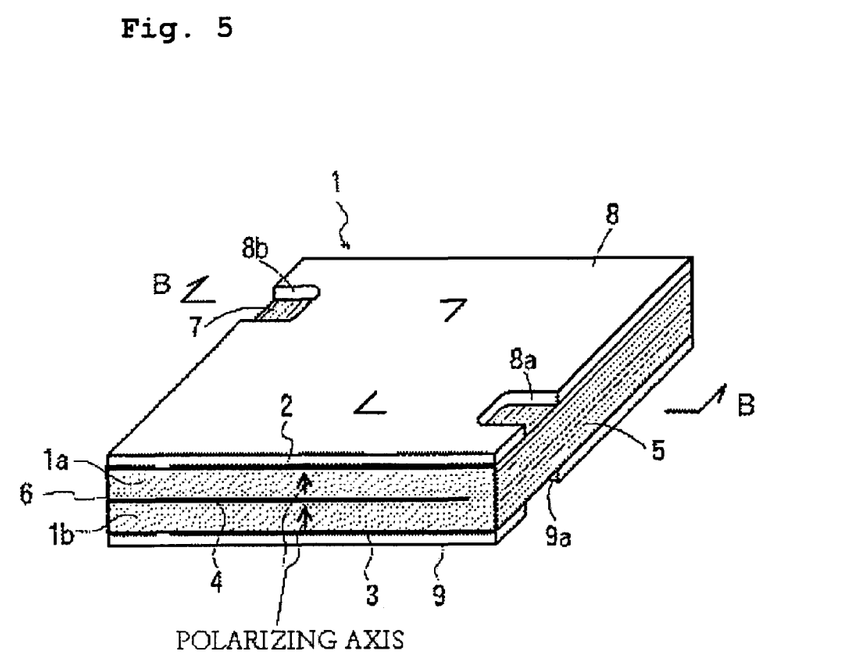
FIG. 5 is a perspective view of a piezoelectric diaphragm used in the piezoelectric electroacoustic transducer shown in FIG. 2.
Figure 6:
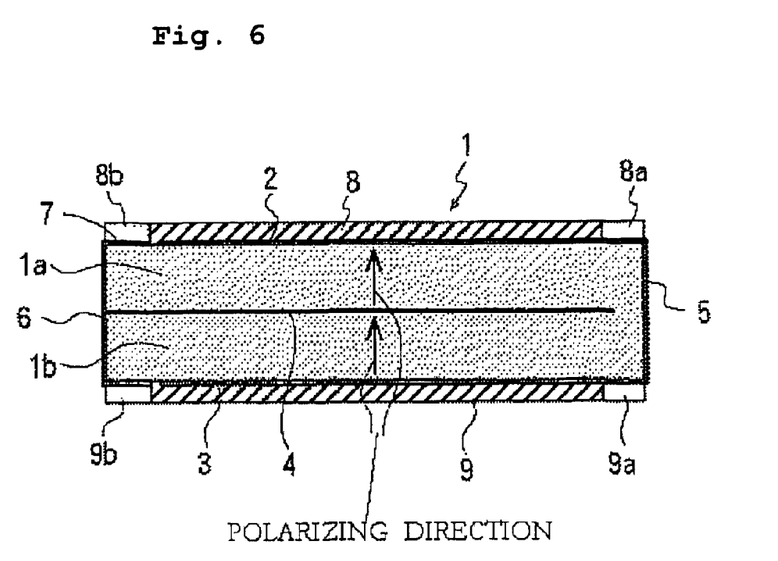
FIG. 6 is a step sectional view along the line B—B of FIG. 5.

The diaphragm 1, as shown in FIGS. 5 and 6, is preferably made by depositing two piezoelectric ceramic layers 1a and 1b and includes principal-surface electrodes 2 and 3 disposed on both principal surfaces and an internal electrode 4 disposed between the ceramic layers 1a and 1b. The two ceramic layers 1a and 1b, as shown by the thick-line arrow in the drawings, are polarized in one thickness direction. The top principal-surface electrode 2 and the bottom principal-surface electrode 3 are preferably slightly smaller than the side length of the diaphragm 1, and one end thereof is connected to an end surface electrode 5 disposed on one end surface of the diaphragm 1. Therefore, the two principal surface electrodes 2 and 3 are connected to each other. The internal electrode 4 is substantially symmetrical with the principal-surface electrodes 2 and 3, and one end of the internal electrode 4 is separated from the end surface electrode 5 while the other end is connected to an end surface electrode 6 disposed on the other end surface of the diaphragm 1. In addition, on both surfaces of the diaphragm 1 at the other end, auxiliary electrodes 7 with small widths are arranged for being electrically connected to the end surface electrode 6.

On the top and bottom surfaces of the diaphragm 1, resin layers 8 and 9 are provided for respectively covering the principal-surface electrodes 2 and 3. The resin layers 8 and 9 are provided for increasing the shatter strength. On the top and bottom resin layers 8 and 9, cut-outs 8a and 9a exposing the principal-surface electrodes 2 and 3 and cut-outs 8b and 9b exposing the auxiliary electrodes 7 are disposed in the vicinities of corners of the diaphragm 1 diagonally opposing each other.

In addition, the cut-outs 8a, 8b, 9a, and 9b may be disposed on only one of the top and bottom surfaces. However, for eliminating the top and bottom directionality, the cut-outs 8a, 8b, 9a and 9b are disposed on both surfaces according to the present preferred embodiment of the present invention.

The auxiliary electrode 7 is not necessarily a band electrode with a predetermined width, and it may be disposed only at a position corresponding to the cut-outs 8b and 9b.

According to the present preferred embodiment, PZT ceramics having approximate dimensions of 10 mm×10 mm×20 $\mu$m is preferably used as the ceramic layers 1a and 1b, and a polyamidoimide resin with a thickness of about 5 $\mu$m to about 10 $\mu$m is preferably used as the resin layers 8 and 9.

Figure 2:
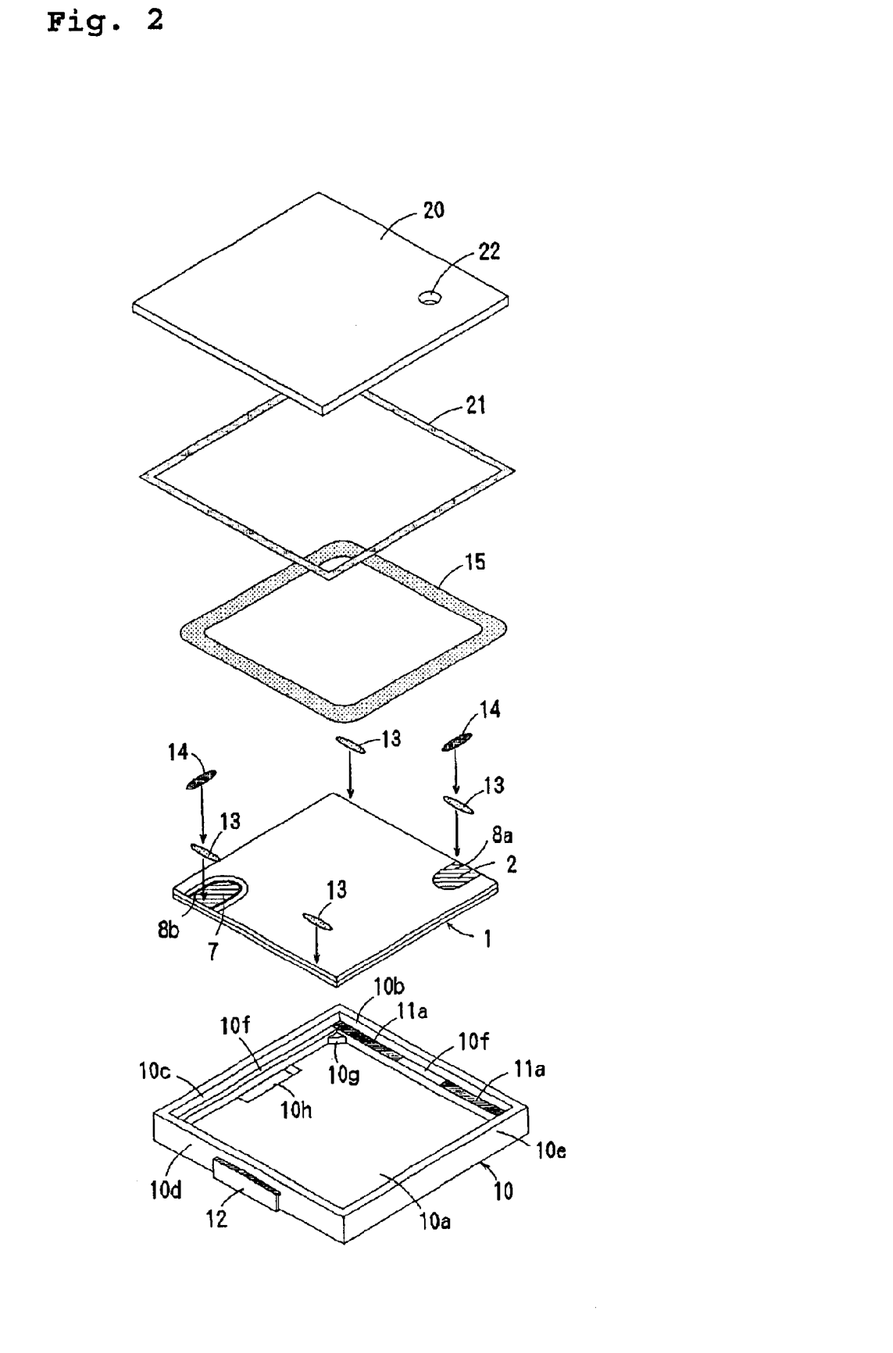
FIG. 2 is an assembly view of a piezoelectric electroacoustic transducer according to a first preferred embodiment of the present invention.

The case 10, preferably made of an insulating material such as ceramics and a resin, has a substantially rectangular box-shape having a bottom wall 10a and four sidewalls 10b to 10e. When forming the case 10 of a resin, a heat-resistant resin may be preferable, such as an LCP (liquid crystal polymer), SPS (syndiotactic polystyrene), PPS (polyphenylene sulfide), and an epoxy resin. In internal peripheries of the four sidewalls 10b to 10e, steps 10f are configured in an annular arrangement. Over the steps 10f inside the two opposing sidewalls 10b and 10d, internal connections 11a and 12a of a pair of terminals 11 and 12 are exposed. The terminals 11 and 12 are disposed in the case 10 by insert molding, in which external connections 11b and 12b protruding outside the case 10 are bent along external surfaces of the sidewalls 10b and 10d toward the bottom wall 10a of the case 10. According to the present preferred embodiment, the internal connections 11a and 12a of the terminals 11 and 12 are preferably two-forked, respectively. These two-forked internal connections 11a and 12a are located in vicinities of the corners of the case 10.

Figure 3:
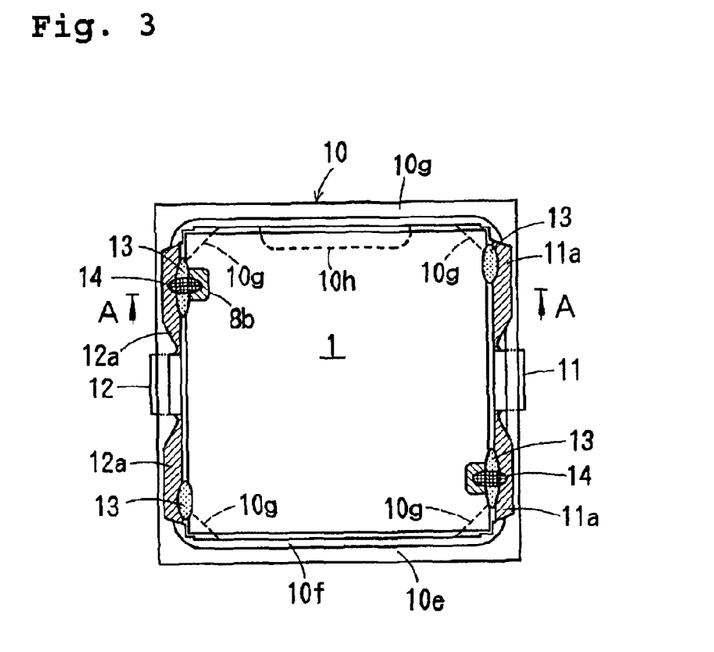
FIG. 3 is a plan view of the piezoelectric electroacoustic transducer shown in FIG. 2 in which a lid plate and an elastic sealant are removed.
Figure 4:
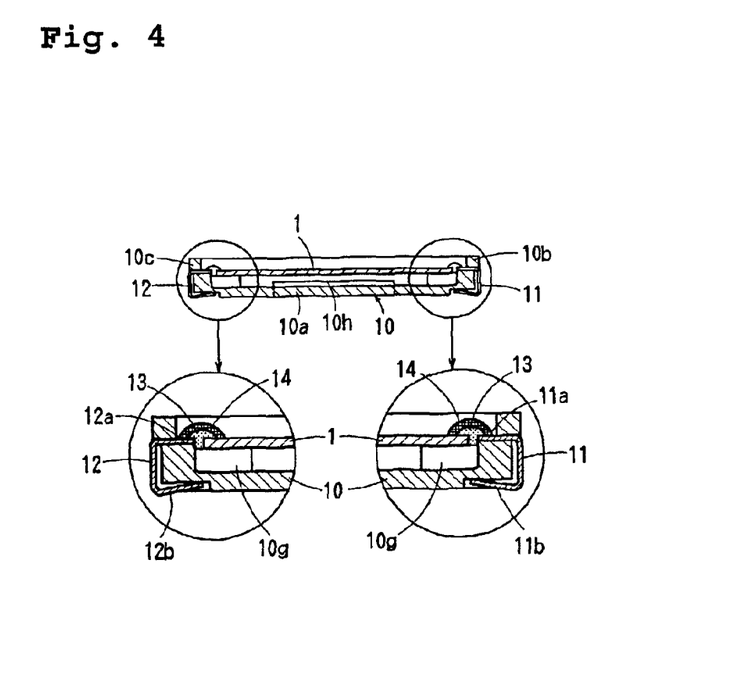
FIG. 4 is a sectional view along the line A—A of FIG. 3.

Four corners inside the steps 10f, as shown in FIGS. 3 and 4, are provided with supporting members 10g disposed at positions lower than the steps 10f by one step for supporting the four corners of the diaphragm 1. Therefore, when placing the diaphragm 1 onto the supporting members 10g, the top surface of the diaphragm 1 substantially corresponds in height with the top surfaces of the internal connections 11a and 12a of the terminals 11 and 12. Wherein the supporting member 10g is substantially triangular-shaped in plan view, and the four supporting members 10g are arranged on the same circumference.

In addition, the bottom wall 10a is provided with a first sound-releasing hole 10h disposed therein.

The diaphragm 1 is accommodated within the case 10 so as to be fixed to the supporting members 10g or to the vicinities thereof at four positions with elastic supporting materials 13. That is, the elastic supporting materials 13 are applied between the principal electrode 2 exposed in the cut-out 8a and the internal connection 11a of the terminal 11, and between the auxiliary electrodes 7 exposed in the cut-out 8b, which diagonally opposes the cut-out 8a, and the internal connection 12a of the terminal 12. The remaining two positions, which are diagonally opposed to each other, are also coated with the elastic supporting materials 13. In addition, the elastic supporting materials 13 are applied in longitudinally aligned, substantially elliptical shapes. However, the coating shape is not limited to the substantially elliptical shape. As the elastic supporting material 13, the urethane adhesive having a Young's modulus after curing of about $3.7 \times 10^6$ Pa may be used, for example. Since the viscosity of the elastic supporting material 13 before curing is high (50 dPa·s to about 120 dPa·s, for example) so as to make it very difficult for the elastic supporting material 13 to spread, and it is also difficult for the elastic supporting material 13 to flow down to the bottom wall 10a through the gap between the diaphragm 1 and the case 10, when it is applied. After applying the elastic supporting material 13, it is heated and cured.

In addition, as a method for fixing the diaphragm 1, after accommodating the diaphragm 1 within the case 10, the elastic supporting material 13 may be applied by a dispenser. Alternatively, the diaphragm 1 may be accommodated within the case 10 in a state in which the diaphragm 1 is coated with the elastic supporting materials 13 in advance.

The coating position of the elastic supporting material 13 may preferably be as close to the supporting member 10g as possible. In FIG. 3, the elastic supporting material 13 is applied at a position that is slightly spaced away from the supporting member 10g. This is because a conductive adhesive 14 is located along side the elastic supporting material 13. Whereas, when the electrodes of the diaphragm 1 and the internal connections 11a and 12a can be arranged at corners of the case 10, the coating position of the elastic supporting material 13 may also be the supporting member 10g.

After curing the elastic supporting materials 13, the conductive adhesives 14 are applied preferably in substantially elliptic shapes on the elastic supporting materials 13 which are applied in substantially elliptic shapes so as to intersect with the elastic supporting materials 13, so that the principal-surface electrode 2 and the internal connection 11a of the terminal 11 are connected together, and the auxiliary electrode 7 and the internal connection 12a of the terminal 12 are also connected together. As the conductive adhesive 14, the urethane conductive paste having a Young's modulus after curing of about $0.3 \times 10^9$ Pa may be used, for example. After the conductive adhesive 14 is applied, it is heated and cured. The coating shape of the conductive adhesives 14 is not limited to a substantially elliptical shape. The coating shape can be any shape that is sufficient to be able to connect between the principal-surface electrode 2 and the internal connection 11a, and between the auxiliary electrode 7 and the internal connection 12a by being located along side the elastic supporting materials 13.

After applying and curing the conductive adhesives 14, the gap between the entire periphery of the diaphragm 1 and the internal periphery of the case 10 is coated with an elastic sealant 15, so that air leakage between the top and bottom surfaces of the diaphragm 1 is prevented. After applying the elastic sealant 15 in an annular arrangement, it is heated and cured. As the elastic sealant 15, the silicone adhesive having a Young's modulus after curing of about $3.0 \times 10^5$ Pa is used, for example.

After fixing the diaphragm 1 to the case 10 as described above, the lid plate 20 is bonded to the upper opening of the case 10 with an adhesive 21. The lid plate 20 is preferably made of the same material as that of the case 10. By bonding the lid plate 20, an acoustic space is formed between the lid plate 20 and the diaphragm 1. The lid plate 20 is provided with a second sound-releasing hole 22 formed therein.

In the manner described above, the surface-mount piezoelectric electroacoustic transducer is completed.

In the electroacoustic transducer according to the present preferred embodiment, when a predetermined alternating voltage is applied to between the terminals 11 and 12, the diaphragm 1 can flexurally vibrate in an area-bending mode. The piezoelectric ceramic layer, which is polarized in the same direction as that of an electric field, contracts in a planar direction while the piezoelectric ceramic layer, polarized in the opposite direction to that of the electric field, expands in the planar direction, so that the entire structure bends in the thickness direction.

According to the preferred embodiment, since the diaphragm 1 has a deposited ceramic structure, and two vibrating regions (ceramic layers) sequentially arranged in the thickness direction vibrate in directions opposite to each other, so that a larger displacement, i.e., larger sound pressure can be obtained in comparison with a unimorph-type diaphragm.

Figure 7:
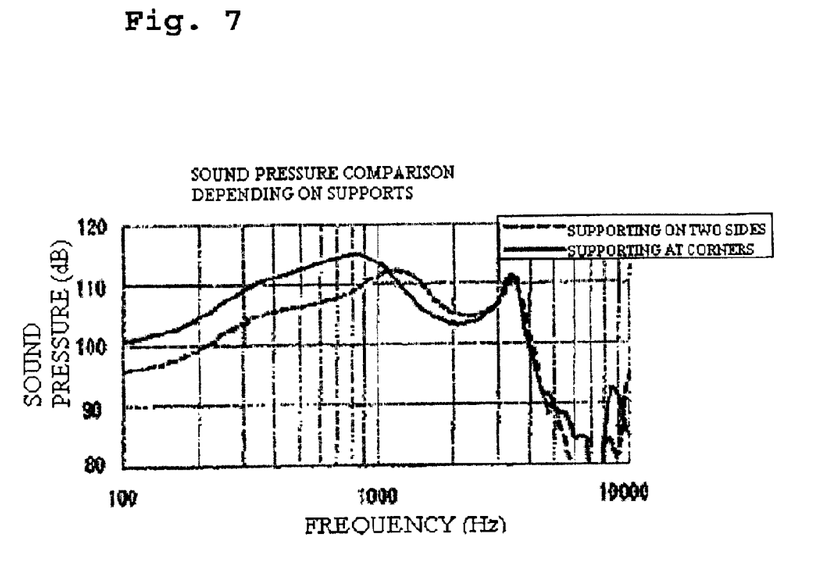
FIG. 7 is a chart for comparing sound pressures when supporting the piezoelectric diaphragm on two sides and when supporting the piezoelectric diaphragm at the corners thereof.

FIG. 7 shows sound characteristics when two opposing sides of the diaphragm 1 are supported on the case and when four corners thereof are supported on the case. As is apparent from the drawing, it is understood that the resonance frequency is approximately 1200 Hz in the former while the resonance frequency is approximately 800 Hz in the latter, so that the resonance frequency is reduced by supporting the diaphragm with the four corners and moreover, the sound pressure at the resonance frequency is increased.

Figure 8:
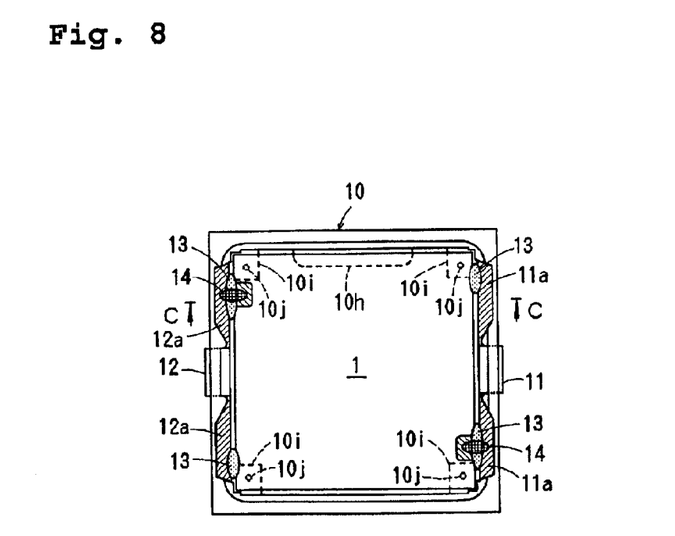
FIG. 8 is a plan view of a piezoelectric electroacoustic transducer according to a second preferred embodiment of the present invention in which a lid plate and an elastic sealant are removed.
Figure 9:
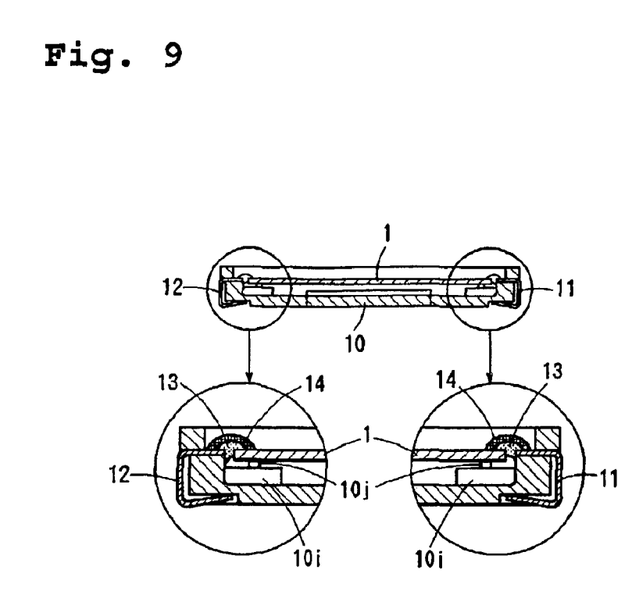
FIG. 9 is a sectional view along the line C—C of FIG. 8.
Figure 10:
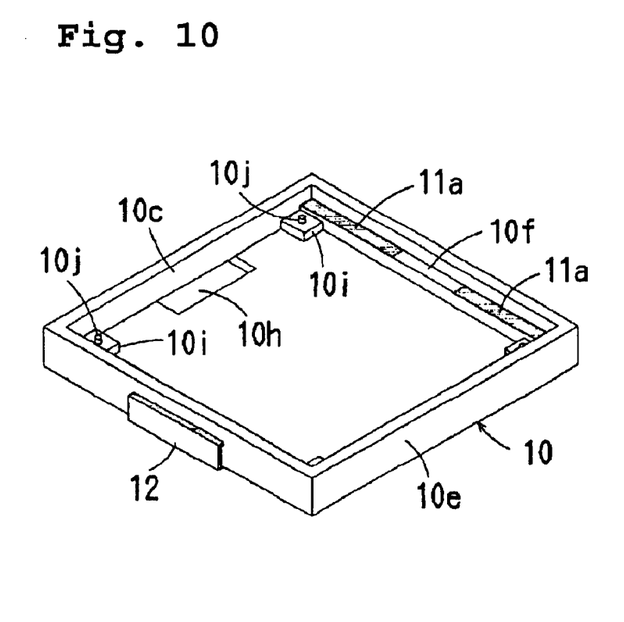
FIG. 10 is a perspective view of a case included in the piezoelectric electroacoustic transducer shown in FIG. 8.

FIGS. 8 to 10 show a piezoelectric electroacoustic transducer according to a second preferred embodiment of the present invention. According to the second preferred embodiment, while seats 10i are arranged at four corners of the case, there are projections 10j disposed on the top surfaces of the seats 10i protruding therefrom, so that bottom surfaces of the corners of the diaphragm 1 are substantially point-supported by the projections 10j.

In this case, the contact area between the diaphragm 1 and the projections 10j is extremely reduced so as not to damp the vibration, thereby improving sound characteristics.

In addition, the steps 10f inside the sidewalls 10c and 10e are omitted in FIG. 10.

According to the second preferred embodiment, the lid plate 20 may be provided with projections disposed on the bottom surface and opposing the projections 10j of the case 10, so as to clamp the diaphragm between these projections from the upper and lower directions.

Figure 11:
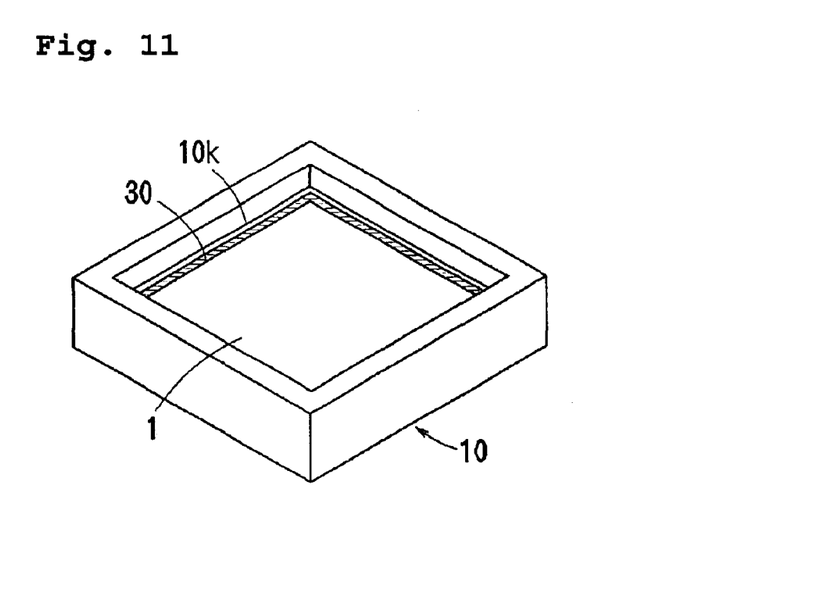
FIG. 11 is a perspective view of a piezoelectric electroacoustic transducer according to a third preferred embodiment of the present invention in which a lid plate is removed.
Figure 12:
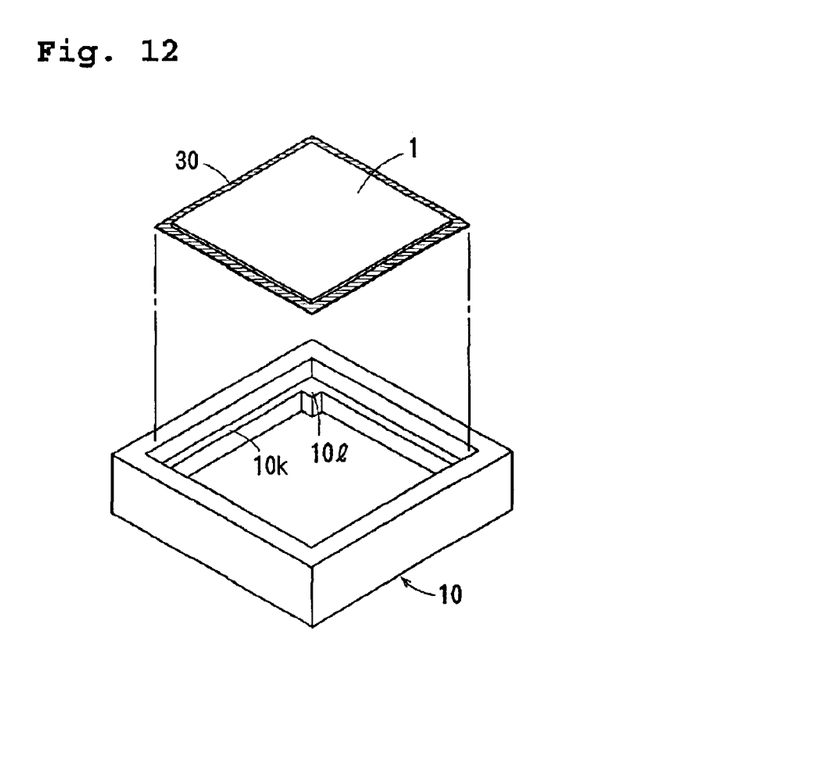
FIG. 12 is an assembly view of a case and a diaphragm shown in FIG. 11.

FIGS. 11 and 12 show a piezoelectric electroacoustic transducer according to a third preferred embodiment of the present invention.

According to the preferred embodiment, while a step 10k is disposed along the entire periphery inside the case 10, supporting members 10l extended inside are disposed at four corners of the step 10k. The step 10k and the supporting members 10l are the same in height. The diaphragm 1 is bonded on a film 30 larger than the diaphragm 1 in size. The four corners of the diaphragm 1 are placed on the supporting members 10l while the four sides thereof are arranged not to mount on the step 10k. For the film 30, an elastic thin-thickness film which does not impede the bending vibration of the diaphragm 1, such as polyimide may be used. The entire periphery of the film 30 is bonded or melted on the step 10k and the supporting members 10l of the case 10.

In this case, because the film 30 performs the functions of fixing the diaphragm 1 to the case 10 and of sealing the clearance to the case 10 as well, the elastic supporting material 13 or the conductive adhesive 14 can be omitted. Also, there is no possibility of damping the vibration of the diaphragm 1 due to excessive coating with the elastic sealant 15.

In addition, the film 30 is not limited to a substantially rectangular bonded on the entire surface of the diaphragm 1, and it may be a frame-shape bonded only to the periphery of the diaphragm 1. The film 30 is also not limited to being bonded only to the bottom surface of the diaphragm 1, and it may be bonded to the top surface or to both surfaces.

According to the present preferred embodiment, in order to stably and reliably support the four corners of the diaphragm 1, convex members may be formed on the bottom surface of the lid plate 20 so as to urge the corners of the diaphragm 1 toward the supporting members 10l with the convex members.

Although the terminals provided in the case 10 are omitted from FIGS. 11 and 12, they are substantially the same as those shown in FIG. 2 or 10. In this case, it may be also required only to connect between the internal connections of the terminals and the electrodes of the diaphragm 1 with the conductive adhesives.

The present invention is not limited to the preferred embodiments described above and it can be modified within the spirit and scope of the present invention.

The piezoelectric diaphragm according to the preferred embodiments is preferably made by depositing two piezoelectric ceramic layers. Alternatively, the piezoelectric diaphragm may be made by depositing three or more piezoelectric ceramic layers.

Also, the piezoelectric diaphragm is not limited to the deposited structure of the piezoelectric ceramic layers. A diaphragm made by bonding a piezoelectric plate on one surface or on both surfaces of a metallic plate may be used.

The terminal electrode according to the present invention is not limited to the inserted terminal according to the preferred embodiments. The terminal electrode may be a thin-film or thick-film electrode extending from the top surface of the supporting member of the case toward outside.

The casing according to the present invention may be any structure as long as it accommodates the piezoelectric diaphragm and has a function to support four corners thereof, and it is not limited to the casing formed of a case having a concave section and a lid plate to be bonded on the top surface of the case, as in the preferred embodiments described above.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric electroacoustic transducer comprising:
   a substantially rectangular piezoelectric diaphragm having electrodes and flexurally vibrating in a thickness direction in response to application of an alternating signal between the electrodes; and
   a casing having the piezoelectric diaphragm disposed therein; wherein
   the casing is provided with supporting members arranged to support only four corners of the piezoelectric diaphragm.

2. A transducer according to claim 1, further comprising:
   terminal electrodes having internal connections exposed in vicinities of the supporting members and external connectionS exposed on the external surface of the casing and electrically connected to the internal connections; and conductive adhesives; wherein the electrodes of the piezoelectric diaphragm and the internal connections of the terminal electrodes are electrically connected together via the conductive adhesives.

3. A transducer according to claim 1, further comprising an elastic sealant, wherein a gap between the external periphery of the piezoelectric diaphragm and the internal periphery of the casing is sealed with the elastic sealant.

4. A transducer according to claim 1, wherein the piezoelectric diaphragm includes a film attached at least to the external periphery of the diaphragm, and a gap between the piezoelectric diaphragm and the casing is sealed by the film which is melted or bonded in the internal periphery of the casing.

5. A transducer according to claim 1, wherein the supporting members provided in the casing are protections arranged to point-support vicinities of four corners of the piezoelectric diaphragm.

6. A transducer according to claim 1, wherein the casing includes a case and a lid plate.

7. A transducer according to claim 1, wherein the electrodes are smaller than a side length of the diaphragm.

8. A transducer according to claim 1, wherein the electrodes are covered by resin.

9. A transducer according to claim 8, wherein cutouts are formed in the resin so as to expose portions of the electrodes.

10. A transducer according to claim 1, wherein the casing includes four sidewalls and steps disposed on internal peripheries of the four sidewalls in an annular arrangement.

11. A transducer according to claim 1, wherein the casing includes internal terminals and internal connections for the internal terminals.

12. A transducer according to claim 11, wherein the internal connections of the internal terminals have a two-forked configuration located in the corners of the diaphragm.

13. A transducer according to claim 10, wherein the supporting members are located at the four corners of the diaphragm inside the steps, and are disposed at positions lower than the steps.

14. A transducer according to claim 11, wherein the top surface of the diaphragm substantially corresponds in height with the top surfaces of the internal connections of the internal terminals.

15. A transducer according to claim 1, wherein the supporting members are substantially triangular-shaped in plan view, and the supporting members are arranged on the same circumference.

16. A transducer according to claim 1, further comprising elastic supporting materials arranged to fix the supporting members to the diaphragm.

17. A transducer according to claim 16, wherein the elastic supporting materials have longitudinally aligned, substantially elliptical shapes.

18. A transducer according to claim 16, wherein the elastic supporting material is a urethane adhesive having a Young's modulus after curing of about $3.7 \times 10^6$ Pa.

19. A transducer according to claim 1, wherein a plurality of seats are arranged at four corners of the case, and projections are disposed on the top surfaces of the seats so as to protrude therefrom.

20. A transducer according to claim 19, wherein bottom surfaces of the corners of the diaphragm are substantially point-supported by the projections.

* * * * *